United States Patent [19]

Calvin

[11] Patent Number: 5,075,644
[45] Date of Patent: Dec. 24, 1991

[54] VOLTAGE CONTROLLED OSCILLATOR WITH FILTERED AND COMPENSATED MODULATION

[75] Inventor: Clarke J. Calvin, Fort Worth, Tex.
[73] Assignee: Motorola, Inc., Schaumburg, Ill.
[21] Appl. No.: 620,817
[22] Filed: Dec. 3, 1990
[51] Int. Cl.⁵ .............................................. H03C 3/00
[52] U.S. Cl. ..................................... 332/136; 332/123
[58] Field of Search ....................... 331/107 R, 108 R; 332/136, 123, 124, 125

[56] References Cited

U.S. PATENT DOCUMENTS 4,189,690  2/1980  Bock et al. ...................... 332/136 X

FOREIGN PATENT DOCUMENTS 0021757  2/1977  Japan ................................... 332/136
0092902  6/1982  Japan ................................... 332/136
0106903  6/1983  Japan ................................... 332/136

Primary Examiner—Robert J. Pascal
Attorney, Agent, or Firm—Daniel K. Nichols

[57] ABSTRACT

Briefly, according to the invention, a voltage controlled oscillator 200 having a control input, an information signal input, and an output is disclosed. The voltage controlled oscillator 200 comprises a tank circuit 202 for generating a carrier signal and a modulator 206 for modulating the carrier signal in response to the information signal 210 at the information signal input of the voltage controlled oscillator 200. The voltage controlled oscillator 200 includes a filter 208 coupling the modulator 206 to the tank circuit 202 for rejecting out of band signals from altering the bias point of the modulator 206.

15 Claims, 4 Drawing Sheets

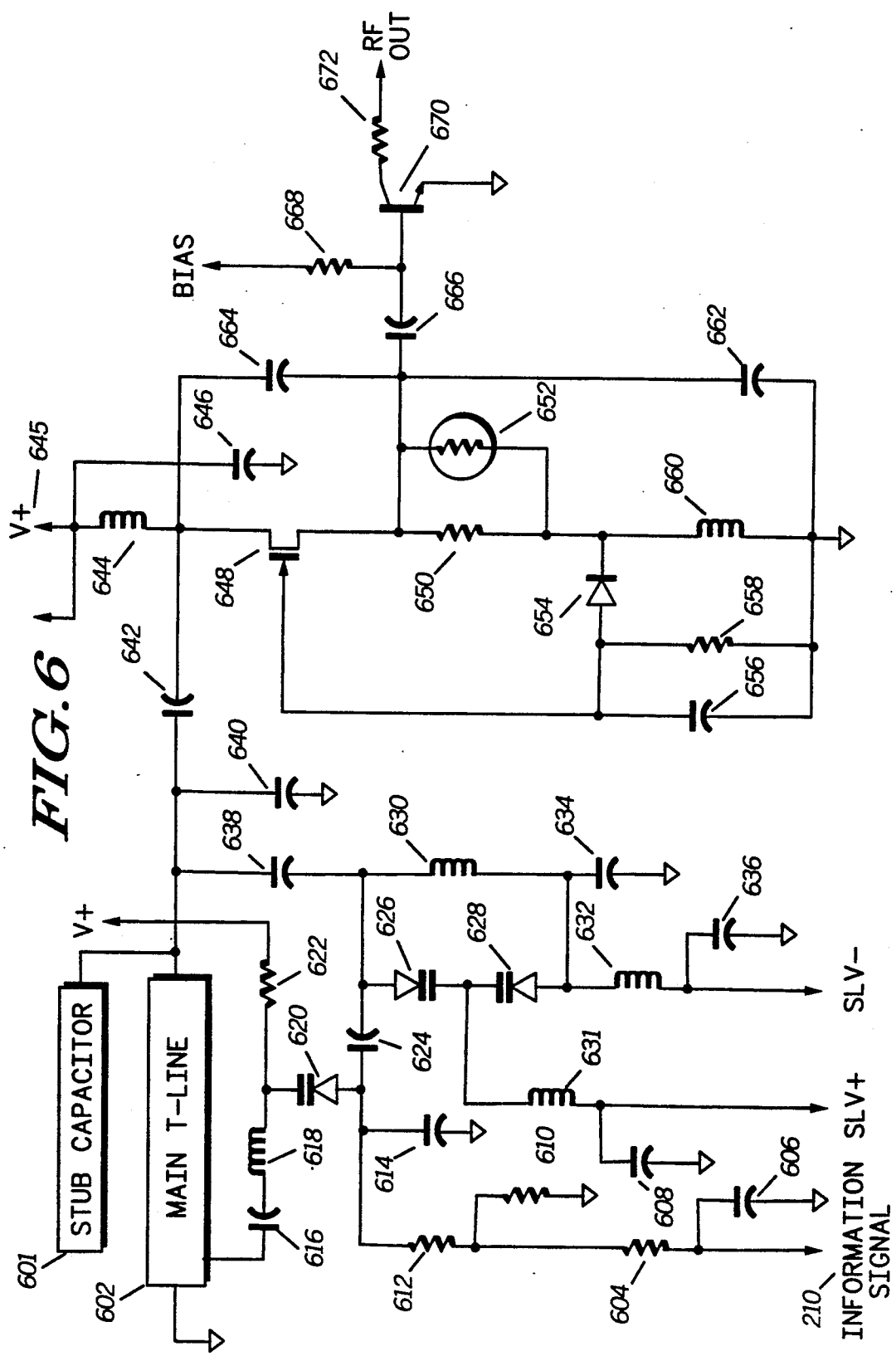

VOLTAGE CONTROLLED OSCILLATOR WITH FILTERED AND COMPENSATED MODULATION

TECHNICAL FIELD

This invention relates generally to communication devices and more specifically to voltage controlled oscillators in such devices.

BACKGROUND

Voltage controlled oscillators (VCO) are well known in the art. The operating frequency of VCO's is often controlled by the application of a voltage to a tuning varactor incorporated in their designs. The operating frequency is then modulated by an information signal using a modulation varactor also incorporated in their design. When the frequency of a VCO is changed by applying a different voltage to the tuning varactor, the tuning varactor capacitance changes and the percentage of the total tank capacitance comprised by the modulation varactor changes. Since the modulating voltage delivered to the modulation varactor is constant and the capacitance percentage changes, the frequency deviation is not constant when the operating frequency of the VCO changes. A technique to compensate for this changing modulation sensitivity would be to de-couple the modulation varactor from the tank as the operating frequency is increased. This would accomplish flat modulation sensitivity over operation frequency which is much desired in today's transmitters.

However, the compensation to achieve flat modulation sensitivity produces a harmonic interference problem. The problem occurs when a harmonic of the VCO tracks through a secondary resonance of the VCO. The resonance allows tighter coupling from the top of the tank to the modulation varactor at the frequency of resonance. As the VCO is tuned and a harmonic reaches this resonant frequency, the harmonic is coupled tighter to the modulation varactor than it was outside of the resonance. The instantaneous voltage across the varactor is changed with the addition of a larger harmonic voltage and this shifts the quiescent operating point of the varactor. Since the capacitance vs. voltage characteristic of the varactor is nonlinear, a constant modulation voltage now produces a different capacitive variation and hence a different frequency deviation. The graph of FIG. 1 shows this phenomenon. The horizontal axis in the graph represents the VCO operating frequency. The vertical axis represents frequency deviation or modulation sensitivity of the VCO. The dotted line 102 shows a typical modulation sensitivity variation as an oscillator harmonic tracks through a secondary resonance in the VCO tank. The harmonic energy is coupled tighter to the modulation varactor than it was outside of the resonance. This harmonic-resonance interaction shifts the bias point of the varactor and changes the modulation sensitivity and the result is a deviation response that is not flat with respect to the operating frequency. The solid graph 104 shows a desired modulation sensitivity as the frequency of the VCO varies.

The approach VCO designers take to deal with this problem is to identify the resonance that is causing the deviation problem and move it out of band. Although this technique works, the VCO is still exposed to other resonances that might move in band due to component and process variations. Since almost every structure of the VCO substrate will resonate somewhere, it is unlikely that the designer will be able to keep all resonances out of all harmonic bands across circuit build variations. This leaves VCOs that use this modulation compensation technique at risk to this deviation flatness problem over process variations. It is therefore clear that a need exists for a VCO that would be tolerant to harmonics-resonance interactions and other interferences.

SUMMARY OF THE INVENTION

Briefly, according to the invention, a voltage controlled oscillator having a control input, an information signal input, and an output is disclosed. The voltage controlled oscillator comprises a generator for generating a carrier signal and a modulator for modulating the carrier signal responsive to the information signal at the information signal input of the voltage controlled oscillator. The voltage controlled oscillator further comprises a filter coupling the modulator means to the generator means for rejecting out of band signals from altering the bias point of the modulator.

BRIEF DESCRIPTION OF THE DRAWINGS

FIG. 6 is a detailed schematic diagram of the VCO in accordance with the present invention.

DETAILED DESCRIPTION OF THE PREFERRED EMBODIMENT

Figure 2:
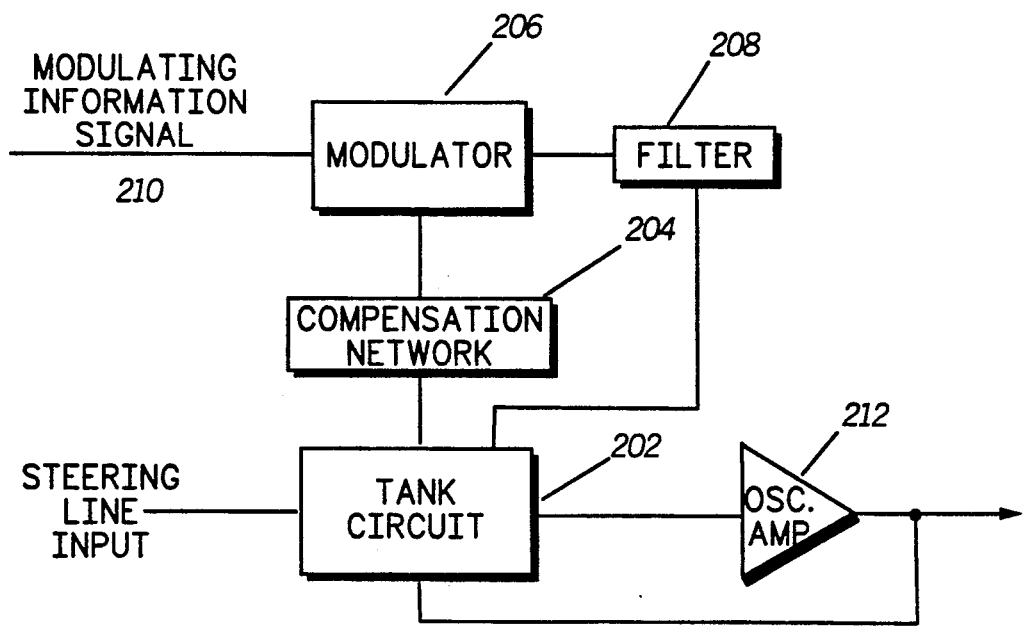
FIG. 2 is a block diagram of the VCO in accordance with the present invention.

Referring to FIG. 2, a block diagram of a VCO 200 is shown in accordance with the principles of the present invention. A tank circuit 202 connected to an oscillation amplifier 212, generates a carrier signal at the operating frequency of the VCO 200. The combination of the tank circuit 202 and the oscillation amplifier 212 constitutes a carrier frequency generator for the VCO 200. The tank circuit 202 is coupled to a modulator 206 via a compensation network 204. The input of the modulator 206 receives an information signal 210 that is intended to modulate the carrier signal generated by the tank circuit 202. The output of the modulator 206 is coupled to a filter 208 and subsequently to the tank circuit 202. The output of the oscillation amplifier 212 is the modulated carrier signal. The elements of the VCO 200 are likely to create secondary resonances which may correspond to a harmonic of the operating frequency. Signals having these resonance frequencies would tend to more tightly couple to various elements of the VCO 200, namely the modulator 206. Such tighter coupling is undesirable and that is where the filter 208 plays a significant role. The filter 208 rejects these signals and prevents them from interfering with the operation of the VCO 200.

Figure 3:
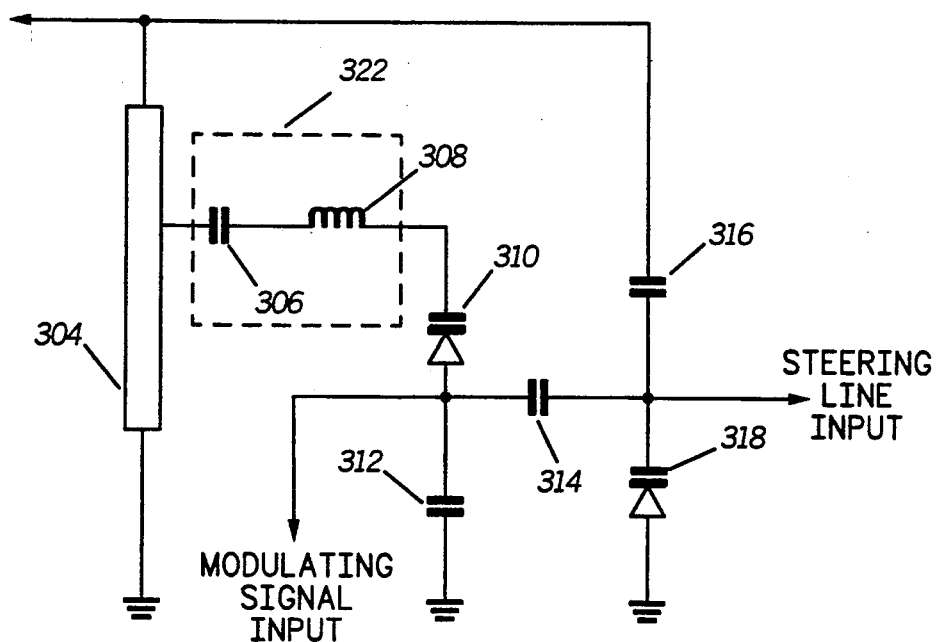
FIG. 3 is a simplified diagram of the varactor circuits of the VCO in accordance with the present invention.

Referring now to FIG. 3, a simplified schematic diagram of a portion of a VCO 200 is shown to concentrate on the essentials of the present invention. Varactor 318 and transmission line 304 form the tank that sets the operating frequency of the VCO 200. The cathode of the tuning varactor 318 is connected to the steering line input. As the voltage on the steering line increases, the capacitance of the tuning varactor 318 decreases resulting in an increase in the operating frequency of the VCO 200. The cathode of the tuning varactor 318 is coupled to the anode of a modulation varactor 310 via a capacitor 314. A modulating information signal is connected to the anode of the modulation varactor 310. The modulation varactor 310 relies on the capacitance of the tuning varactor 318 to set the amount of modulation coupling into the tank of tuning varactor 318 and transmission line 304 via the network of capacitors 312 and 314. The capacitor 316 in conjunction with the varactor 318 set the operating frequency bandwidth of the VCO 200. The cathode of the modulation varactor 310 is coupled to a coil 308 which is connected to a capacitor 306. The coil 308 and the capacitor 306 form a series LC filter 322 with low pass characteristics that rejects signals out of the band of the operating frequency of the VCO 200 which includes the harmonics of the operating frequency of the VCO 200. These harmonics, if not attenuated, will modify the bias point of the modulation varacter 310 which results in unacceptable fluctuations in the modulation sensitivity of the VCO 200. The filter 322 in effect reduces the modulation varactor's sensitivity to the harmonic-resonance interactions. This is accomplished by allowing proper modulation and compensation at the fundamental operating frequency yet attenuating harmonic frequencies before they reach the modulation varactor 310.

To summarize, the filter 322 is used to minimize the interferences caused by the secondary resonances that occur within the harmonic bands of the VCO 200. With the filter 322 these secondary resonances are not a problem since any resonance induced increases in coupling to the modulation varactor 310 are attenuated by the filter 322 and prevented from reaching the modulation varactor 310 and moving its operating point. The result is a VCO with a deviation flatness performance that is not affected by harmonic-resonance interactions.

Figure 4:
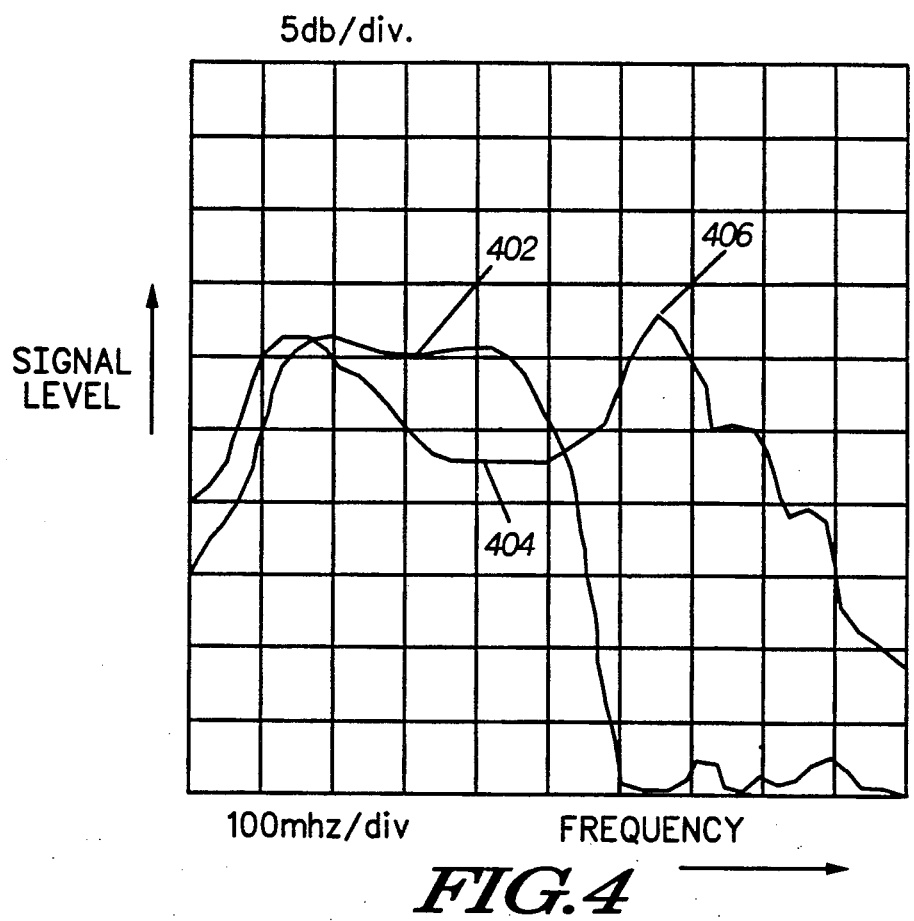
FIG. 4 is a graph of the response of the filter of the VCO in accordance with the present invention.

Referring now to FIG. 4, a graph 400 of the response of the filter 322 is shown in accordance with the present invention. The graph 400 shows two plots of a sweep from the top of the tank to the modulation varactor 310 with and without the filter 322. The vertical axis indicates the signal level while the horizontal axis shows the operating frequency of the VCO 200. The plots 402 and 404 show the sweep with and without the filter 322 respectively. Note that a secondary resonance shown by 406 in the unfiltered response 404 is greatly attenuated by the filter 322. This attenuation minimizes harmonic-resonance interactions.

Figure 1:
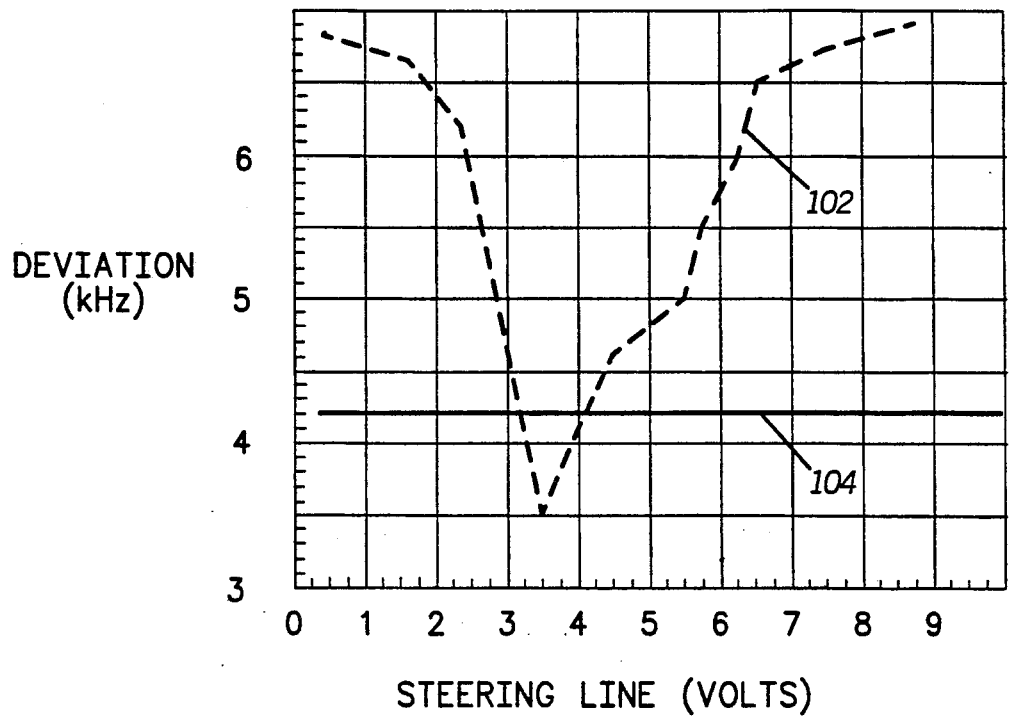
FIG. 1 is a plot of the frequency deviation vs. the steering line voltage in a compensated VCO circuit with no filters.
Figure 5:
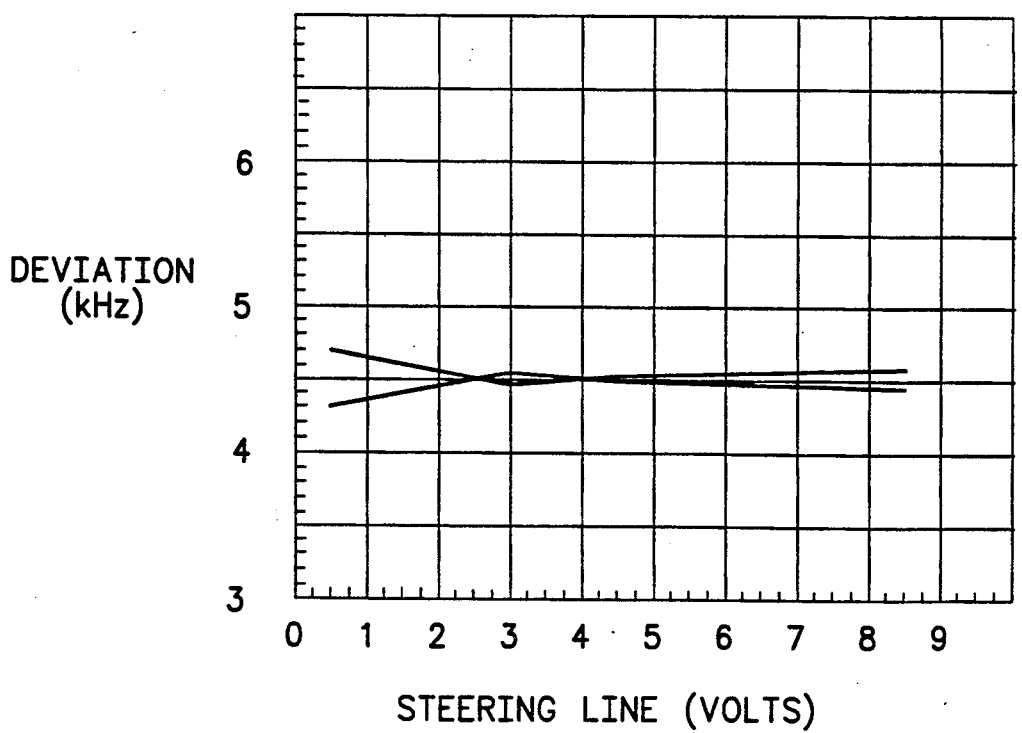
FIG. 5 is a plot of the frequency deviation vs. VCO operating frequency in a compensated VCO circuit with the filter in accordance with the present invention.

FIG. 5 shows the modulation sensitivity variation of the VCO 200 with the filter 322. The horizontal axis in the graph of FIG. 5 represents the steering voltage level which determines the operating frequency of the VCO 200. The vertical axis represents frequency deviation or modulation sensitivity of the VCO 200. In this graph the expected operation of the filter 322 is captured. As can be seen the modulation sensitivity follows a desirable straight line with or without any interactions as the steering line voltage hence the VCO frequency varies. A comparison of FIG. 1 and FIG. 5 reveals that the use of filter 322 has eliminated variations in the modulation sensitivity as oscillator harmonics track through a secondary resonance in the VCO tank.

Referring now to FIG. 6, a detailed schematic diagram of the VCO 200 is shown in accordance with the present invention. The operation of VCO's is well known in the art. A detailed description of the entire operation of the VCO 200 is therefore avoided. The VCO 200 utilizes a common gate FET 648 in a Colpitts configuration as the gain device. The LC tank circuit's capacitive portion consists of a varactor bank 626 and 628 and a laser trimmed stub capacitor 601. The inductive portion consists of microstrip transmission line resonator 602. A bank of varactors comprising varactors 626 and 628 is used as the tuning element of the tank circuit 202 which includes the inductor 630. The cathodes of both varactors 626 and 628 are connected to the inductor 631 which is used to couple the positive steering voltage to the tank circuit 202. The negative steering voltage is connected to the anode of the varactor 628 via the inductor 632 and the anode of varactor 626 via the inductor 630. The inductors 631 and 632 are high frequency chokes and present a high impedance to high frequency signals. The capacitors 608 and 636 are bypass capacitors to bypass high frequency signals that may ride on the steering lines. The network of varactors 626 and 628 changes the oscillator frequency when the DC voltage of the steering line changes.

Varactor 620, a third varactor tapped into the main transmission line resonator, frequency modulates the oscillator during transmit. The V+ line 645 supplies DC bias to the cathode of the varactor 620 via a resistor 622; the anode is referenced to DC ground through a resistor 610. The modulating information signal 210 is coupled to the anode of the varactor 620. A capacitor 606 and resistors 604 and 612 provide filtering and attenuation to the modulation path. The cathode to the modulation varactor 620 is connected to the transmission line resonator 602 via a filter comprising an inductor 618 and a capacitor 616. The inductor 618 and the capacitor 616 form a low pass filter in this embodiment represented by the filter block 208 in the block diagram of FIG. 2. Other filter topologies with bandpass characteristics may be used in place of filter 208 to result in other desirable responses. Although the objective of the filter 208 in this embodiment has been to reject the harmonic-resonance interactions, one can easily design other characteristics into the filter 208. Some desirable characteristics of the filter 208 includes rejection of all interacting signals outside the operating band of the VCO 200 that may be necessary in some applications.

Capacitor 656, resistor 658 and diode 654 provide automatic gain control for the FET 648. Diode 654, a hot carrier diode, detects the peak RF voltage swings on the source of the FET 648. A negative voltage, proportional to the magnitude of the RF voltage swing, is applied to the gate of the FET 648, thereby lowering its gain and accomplishing automatic gain control. The output of the FET 648 is coupled through a capacitor 666 to a transistor 670 to amplify the signal and provide load isolation for the VCO 200.

Those skilled in the art will recognize that various modifications and changes could be made with respect to the above described invention, without departing from the spirit and scope of the invention as set forth. Therefore, it should be understood that the claims are not to be considered as limited to the particular embodiments set forth in the absence of specific limitations expressly incorporating such embodiments.

Figure 7:
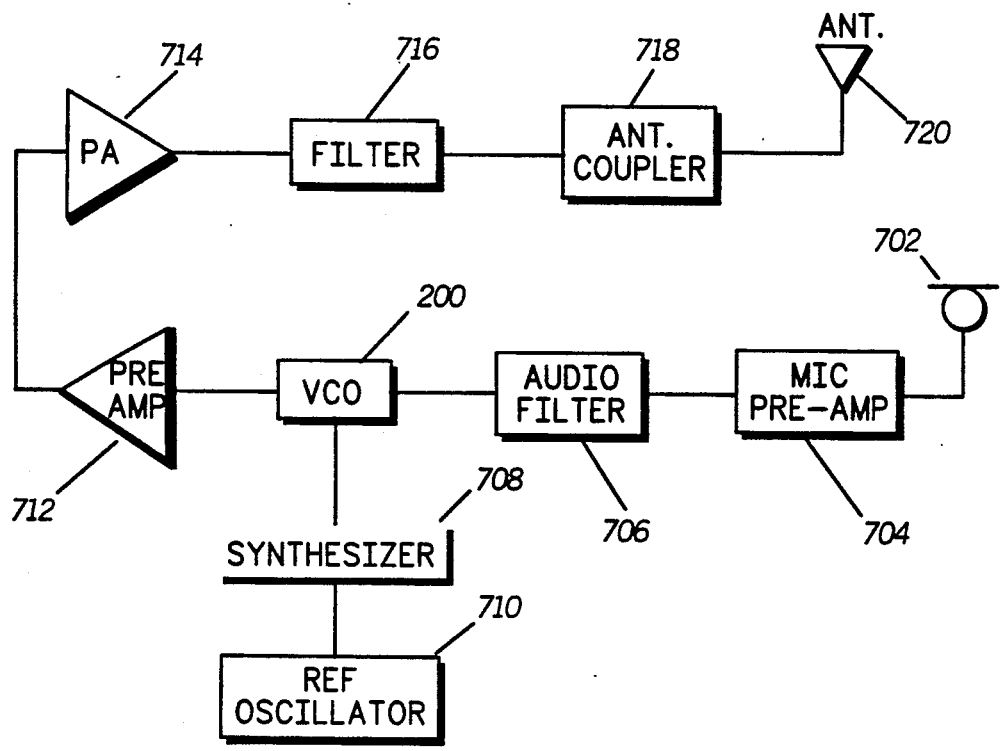
FIG. 7 is a block diagram of a communication device in accordance with the present invention.

Referring to FIG. 7 a block diagram of communication device 700 is shown in accordance with the present invention. The output of a microphone 702 is amplified by a pre-amplifier 704 whose output is connected to an audio filter 706. The audio filter 706 filters the audio output of the preamplifier 704 to conform with the desired performance characteristics of the communication device 700. The filtered audio signal at the output of the filter 706 is the information signal 210 and is coupled to the VCO 200. The VCO 200 is connected to a synthesizer 708. A reference oscillator 710 provides the synthesizer 708 with a reference signal. The VCO 200 in conjunction with the synthesizer 708 and the reference oscillator 710 generates a carrier signal at the desired frequency of the communication device 700. This carrier signal available at the output of the VCO 200 is frequency modulated with the information signal 210. The output signal of the VCO 200 is amplified by a preamplifier 712 and further amplified by a power amplifier (PA) 714. The output of the power amplifier 714 is filtered by a filter 716. The filter 716 attenuates harmonics of the carrier signal and other undesired signals to levels acceptable to regulatory agencies regulating the radio frequency communications in a particular area. The filtered radio frequency signal at the output of the filter 716 is coupled to an antenna coupler 718. The antenna coupler 718 performs impedance matching and signal switching if desired. The output signal of the antenna coupler 718 is coupled to an antenna 720 for transmission.

Those skilled in the art appreciate the availability of other transmitter circuits to achieve similar results. The presentation of this transmitter should be construed only as an example (and not as a limitation) to further clarify the preferred embodiment of the present invention.

What is claimed is:

1. A voltage controlled oscillator having a control input, an information signal input and an output, comprising:
   generator means for generating a carrier signal;
   modulator means coupled to the generator means for modulating the carrier signal responsive to an information signal on the information signal input, the modulator means having a modulation sensitivity; and
   filter means for coupling the modulator means to the generator means for preventing harmonic resonance interactions affecting the modulation sensitivity.

2. The VCO of claim 1, wherein the filter means comprises a low pass filter.

3. The VCO of claim 2, wherein the low pass filter comprises a series LC filter.

4. The VCO of claim 1, wherein said generator means comprises a tank circuit.

5. The VCO of claim 4, wherein said tank circuit includes a varactor.

6. The VCO of claim 1, wherein said modulator means comprises a varactor.

7. A modulation device having an input and an output, comprising:
   VCO means for generating a carrier signal modulated with an information signal available at the input of the modulation device, said VCO means including:
   first means for producing the carrier signal;
   second means for modulating the carrier signal, the second means having a modulation sensitivity; and
   filter means for coupling the first means to the second means for preventing harmonic resonance interactions affecting the modulation sensitivity.

8. The modulation device of claim 7, wherein said first means comprises a tank circuit.

9. The modulation device of claim 8, wherein said tank circuit includes a varactor.

10. The modulation device of claim 7, wherein said second means comprises a varactor.

11. The modulation device of claim 7, wherein said filter means comprises a low pass filter.

12. A voltage controlled oscillator, comprising:
    a tank circuit including at least one tuning varactor;
    an oscillation amplifier coupled to the tank circuit;
    a modulation varactor coupled to the tank circuit; and
    a filter coupling the modulation varactor to the tank circuit for minimizing interference within the harmonic bands of the VCO.

13. The voltage controlled oscillator of claim 12, wherein said filter comprises a bandpass filter.

14. The voltage controlled oscillator of claim 12, wherein said filter comprises a low pass filter.

15. A communication device, comprising:
    means for transmitting a communication signal, including a voltage controlled oscillator, said voltage controlled oscillator comprising:
    a tank circuit including a tuning varactor;
    a modulation varactor coupled to the tank circuit;
    an oscillation amplifier coupled to the tank circuit; and
    a filter coupling the modulation varactor to the tank circuit for minimizing interference within the harmonic bands of the voltage controlled oscillator.

* * * * *